US008760150B1

(12) United States Patent  
Bierer

(10) Patent No.: US 8,760,150 B1  
(45) Date of Patent: Jun. 24, 2014

(54) ELECTRICAL POWER TRANSFER INDICATOR SYSTEM AND METHOD

(76) Inventor: Walter S. Bierer, Blythewood, SC (US)

( * ) Notice: Subject to any disclaimer, the term of this patent is extended or adjusted under 35 U.S.C. 154(b) by 396 days.

(21) Appl. No.: 13/177,077

(22) Filed: Jul. 6, 2011

Related U.S. Application Data

(60) Provisional application No. 61/362,416, filed on Jul. 8, 2010.

(51) Int. Cl.  
G01R 19/22 (2006.01)

(52) U.S. Cl.  
USPC ............... 324/119; 324/66; 324/72; 340/659

(58) Field of Classification Search  
USPC ........................................................ 324/66  
See application file for complete search history.

(56) References Cited

U.S. PATENT DOCUMENTS

| | | | | |
|---|---|---|---|---|
| 4,819,116 A * | 4/1989 | Piteo | ................................ | 361/18 |
| 4,906,938 A | 3/1990 | Konopka | | |
| 5,352,985 A | 10/1994 | Simon | | |
| 5,497,094 A | 3/1996 | George | | |
| 5,625,283 A * | 4/1997 | Badenlou | ......................... | 324/74 |
| 5,969,516 A | 10/1999 | Wottrich | | |
| 6,054,931 A | 4/2000 | Wottrich | | |
| 6,154,032 A | 11/2000 | Coia et al. | | |
| 6,392,395 B2 | 5/2002 | Roberts et al. | | |
| 6,442,434 B1 * | 8/2002 | Zarinetchi et al. | ............... | 607/61 |
| 6,731,082 B2 * | 5/2004 | Pelonis | ..................... | 318/400.26 |
| 7,391,168 B1 * | 6/2008 | Dernovsek et al. | ........... | 315/291 |
| 7,840,829 B2 * | 11/2010 | Mizukami et al. | ............ | 713/340 |
| 2005/0207097 A1 * | 9/2005 | Neace | ............................ | 361/627 |
| 2007/0007621 A1 * | 1/2007 | Omura et al. | .................. | 257/529 |
| 2011/0026660 A1 * | 2/2011 | Meier et al. | .................... | 376/228 |

* cited by examiner

Primary Examiner — Arleen M Vazquez  
Assistant Examiner — Feba Pothen  
(74) Attorney, Agent, or Firm — Michael A. Mann; Nexsen Pruet, LLC

(57) ABSTRACT

Power transfer over power lines is indicated using a controller to short power lines briefly near the end of the positive portion of the alternating voltage cycle of a distant power generation source using a silicon-controlled rectifier thereby creating current pulses from the voltage produced by that source and at a frequency consistent with the source's electric system frequency. The pulse can be detected and measured on other parts of the same circuit using a probe. The controller and probe may be used for locating cables in the same electrical circuit, sorting particular cables in the same circuit from others cables, verifying the condition of cables, determining the source and load feeds on the primary side of a transformer from the low side of the transformer, locating unwanted ground faults, and determining the portion of the electrical load provided by each of plural generation plants.

20 Claims, 8 Drawing Sheets

ELECTRICAL POWER TRANSFER INDICATOR SYSTEM AND METHOD

PRIORITY CLAIM

Priority is claimed to U.S. provisional patent application Ser. No. 61/362,416 filed 8 Jul. 2010, which is incorporated herein in its entirety by reference.

BACKGROUND OF THE INVENTION

In a modern electrical power grid, power is distributed from power lines through transformers to consumers of power, such as industrial facilities commercial facilities, businesses and residences. The resulting distribution network often requires those who service it to identify which power line is the right one and whether it is functioning properly. For example, there may be an unwanted ground somewhere on a floating delta three-phase power line that is miles long. Lineman must determine which line and where on that line the ground has occurred. In another example, a homeowner may complain about unsteady electrical power from an outlet. The source of the problem may be in the power supply between the outlet and the fuse box or between the fuse box and the nearest transformer, or farther down the line. In still other examples, cables from the fuse box to the transformer outside may be shorted or failing, or a fuse box may not be labeled correctly so that, when one apartment resident of many is moving and the electricity to that apartment is to be turned off, a utility service technician will need to identify which cables at the transformer serve the meter corresponding to that apartment.

An electric utility may want to verify which power line at a substation transformer is connected to the electrical source and which is connected to a load, or it may want to know what part of the load it is supplying on a grid supported by several other electric utilities, particularly if there is a new industrial facility soon to come on line.

In each of these and other examples, electrical power is being transferred —or should be transferred—from one part of the electrical distribution or transmission network to another. In order to make the network work, linemen and service technicians need to be able to identify whether power is being transferred, over which lines it is being transferred and perhaps how well it is being transferred and how much electrical power is being transferred.

SUMMARY OF THE INVENTION

According to its major aspects and briefly recited, the present invention is a system and method for indicating power transfer between power lines that are part of an electrical power distribution or transmission network providing alternating current via those power lines.

The system includes a controller having two leads and a rectifier. The controller and rectifier can be connected using the two leads to two power lines in an electrical power system. When connected to power lines, the two leads are in series with the rectifier between them. The leads may carry fuses, and ideally carry separate fuses. The rectifier has a non-conducting state and a conducting state, and is controlled by a processor which can activate the rectifier and cause a very near to a short circuit in the two electrical power lines. When the two power lines are shorted near the end of the positive voltage cycle, the rectifier will conduct but only briefly from when it is activated by the processor until the voltage crosses from positive to negative. The rectifier will of course not conduct when the voltage is negative. Accordingly, the length of the resulting direct current pulse is determined by the timing of the processor's signal to the rectifier to conduct but is intentionally made short in duration. Increasing the duration of the pulse, by having the processor initiate conduction across the rectifier incrementally earlier in the alternating voltage cycle, also increases the magnitude of the current of the pulse. Pulsing may be continued as long as needed and its duration may be adjusted as desired.

By generating this current pulse generated from the voltage already carried on the line, considerable information can be obtained. For example, by detecting the current pulse on a power line one kilometer from where the controller caused the pulse but not detecting it on that same line two kilometers away, one may learn that there is an unwanted ground fault somewhere between the first and second kilometers of power line. For a second example, if the present controller causes a pulse to appear on the power cables at the electric meter of an apartment where the electricity is to be cut off, that pulse can be detected in the one and only one set of what may be many sets of power cables at the transformer associated with all the apartments served by that transformer, namely, the one set that distributes electric power to the specific apartment associated with that electric meter. Detection of the DC pulse on a set of those transformer cables positively identifies the set of cables leading from the transformer to that apartment's electric meter.

Similarly, because detecting that pulse can also indicate direction of the current flow, the detecting probe can indentify which cables run from an electric source and which run to a load, and, with a suitable probe, it can measure the magnitude of the current as well. Accordingly, it can be used to determine the portion of electrical energy generated by a source that is consumed by a load receiving power from that particular source.

These and other uses of the present system and method will be apparent to those skilled in the art of electrical power distribution measurements and power line servicing from a careful reading of the Detailed Description of Embodiments of the Invention, accompanied by the following drawings.

BRIEF DESCRIPTION OF THE DRAWINGS

In the figures.

DETAILED DESCRIPTION OF EMBODIMENTS OF THE INVENTION

Figure 1:
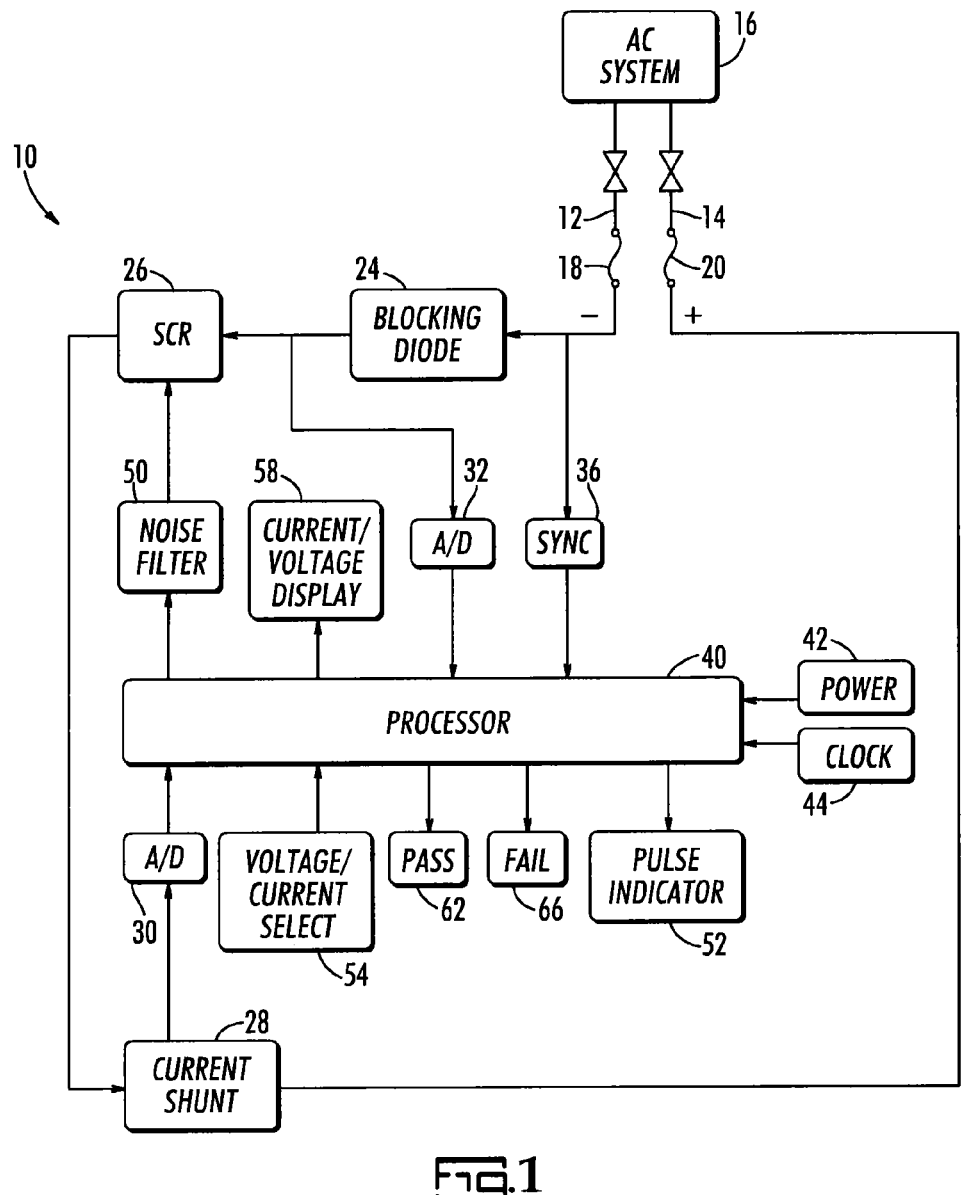
FIG. 1 is a schematic diagram of a controller according to an embodiment of the present invention.
Figure 2:
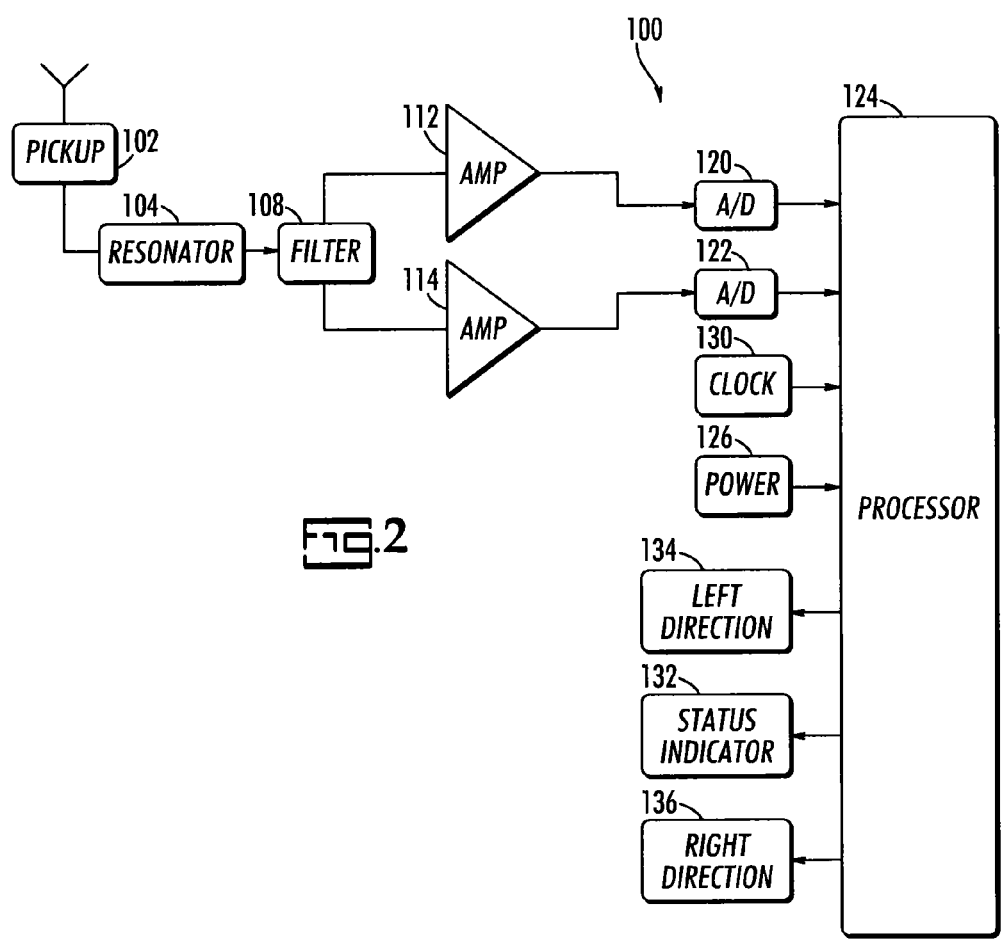
FIG. 2 is a schematic diagram of a receiver probe for use with the controller of FIG. 1, according to an embodiment of the present invention.

The present invention is a system and method for indicating electrical power transfer. The present system and method is intended to be used with an electrical power system that operates on sinusoidally alternating current and, with suitable adaptations, on systems that transfer electrical power from high power transmission lines to household power cables. The term "indicating" ranges in meaning, depending on the particular configuration of and method for using the present system, from simply confirming the transfer of electrical power (or not), to determining the completeness of the transfer (whether all or only a portion of the power is being transferred), to quantifying the percent of the power consumed by the load that is provided by a particular generator. The phrases "power line" and "power cable" refer to electrical conductors running between end points. The term "short" in the context of a short circuit will be used herein not in the literal sense but in the sense of very nearly a true short circuit, that is, where the resistance between two conductors will be very small compared to the voltage on the lines, primarily the series resistance of a silicon controlled rectifier, a forward biased diode, and a current shunt (precision low ohmic value resistor) when they are conducting.

Electrical power is transferred from one portion of a power line to another portion of the same line or, through transformers, from one line to another. The present system and method assists in indicating (1) whether two distant portions of a power lines are in fact parts of the same line, (2) which power line at a transformer runs from the source and which runs to the load, (3) which power lines of many power lines at a transformer is in electrical connection with residential power lines, (4) the condition of a power line (i.e., its impedance), and (5) how much of the load's power needs are being provided by a particular electrical power source.

In order to perform these functions, the present system uses a controller that causes the source (or sources) of electrical power to the electric system, which source may be hundreds of miles away, to generate a current pulse. That pulse seeks and transfers a small amount of power to the controller. Prior art devices apply a voltage or current pulse on top of the existing voltage or current signal carried on a power line. Importantly, unlike the present invention, the pulsed signal of these prior art devices goes from the pulsing device onto every conductor that is in electrical connection with the line the pulser is attached to. Accordingly, the signals generated by prior art devices may appear in many parallel circuits regardless of whether they are power sources or loads. As a result, the correct signal on the correct conductors can only be determined by painstakingly testing and retesting each cable in a plural set of cables until the strongest signal is found. In contrast, the present controller causes the source of primary power on a power line to pulse rather than forcing it to accept a pulse on top of its existing voltage or current from a different electrical source. This self-generated pulse is created by shorting two power lines very briefly. This current pulse then exists only in the series circuit between the generation source and the controller, not in parallel circuits.

Another very important feature of the present invention is that it must operate within the frequency response (frequency band-pass) consistent with its power system, such as 60 Hz or multiples of the frequency of the electrical power system, although the controller with its on-board processor may automatically adjust the pulse width (within that frequency response) until the desired magnitude of current pulse is obtained. This feature means that the desired power and associated current pulse will be transferred through all transformers from the generation source to the controller regardless of the specific electric system frequency band-pass. This feature is totally unlike prior art high frequency pulsing and signaling devices that produce a fixed signal of a fixed frequency that is outside of the frequency band-pass filters of most transformers. When a high-current, high-frequency pulsing device is attached to a standard transformer, it will cause the voltage sine-wave to collapse instantaneously and for the duration of the demand for the high frequency current pulse. This instantaneous collapse in voltage has two consequences. First, it causes an associated high frequency change in current in all associated parallel circuits, which is why prior art devices cause the pulsed signal to be on all parallel circuits associated with the circuit of interest and why the circuit of interest may only be identified by tediously determining the strongest high frequency current pulse among those circuits manifesting a pulse. Second, the instantaneous voltage collapse does not allow the high frequency pulse to travel through a standard power system transformer. Note that the voltage wave does not collapse on the primary side of the transformer.

The ability of the power and current pulse to be transferred through a standard power system transformer is one of the most significant features of the present invention. If the present controller is attached to the secondary side of a transformer that has plural leads attached to the primary side, the probe of the present invention can then easily identify which of those plural leads runs from the source and which runs to the load.

Referring now to FIG. 1, there is shown a schematic diagram of the present controller 10. Controller 10 has two leads 12, 14, connected to power lines from a distance source 16 of alternating current electrical power generation. Each lead 12, 14, includes a fuse 18, 20, to protect controller 10. Lead 12 may be in electrical connection with a blocking diode 24 and then a silicon controlled rectifier (SCR) 26. An SCR is a half-wave rectifier, so it has a conductive state for the positive half of the alternating current cycle and an non-conductive state for the negative half of the cycle. A small amount of current is required to trigger SRC 26 to operate in its conducting state and it will continue to remain in its conductive state. When the voltage on the power line crosses the positive-to-negative voltage boundary, SRC 26 ceases to conduct, and enters its non-conducting state. Blocking diode 24 does not affect the conducting state but augments the reverse current characteristics of SCR 26 in its non-conducting state.

The output of SCR 26 and lead 14 are connected to a current shunt 28. When SCR 26 is conducting, leads 12 and 14 are shorted through current shunt 28; when SCR 26 is not conducting, such as when the current changes from positive to negative, leads 12 and 14 are open. If the duration of the shorting of leads 12 and 14 is small, that is, the conducting state is short, then the current across them spikes, thereby defining a short pulse. A shorter pulse has a lower peak current because the start of the pulse is triggered later in the positive portion of the alternating voltage sine wave as the voltage is returning to zero; a longer pulse has a higher peak current. In addition, the pulse produced in this manner is naturally a DC output pulse, and thus lead 14 is positive with respect to lead 12.

A small amount of the current pulse is directed from current shunt 28 to a first analog-to-digital (A/D) converter 30 for use in measuring the magnitude of the current of the pulse. A second A/D converter 32 is electrically connected to the input side of SCR 26 to measure the instantaneous voltage across SCR 26. A synchronizing circuit 36 electrically connected to lead 12 detects the positive and negative crossings of the AC sine wave.

Controller 10 also includes a processor 40. Processor 40 receives its power from a power source 42 such as a battery, which may be a 9 volt battery for hand held controllers 10, or from household (AC) power rectified and adapted to provide DC electric power suitable for processor 40. A clock oscillator 44 inputs to processor 40 a precision clock pulse so that processor 40 functions as a timer to activate SCR, thereby changing it to its conductive state. Controller 10 may be fitted within a small hand-held housing such as that illustrated in FIG. 5.

The primary output from processor 40 is a small DC current to SCR 26 to activate SCR 26, whereby SCR 26 responds to processor 40 by conducting across leads 12, 14, thereby very nearly shorting them. The DC current is passed through an electrical noise filter 50 to assure the triggering of SCR 26, and the start of the DC current pulse, is well-defined. Processor 40 also outputs an electrical signal to a pulse indicator LED 52 to indicate to the user that pulses are being generated.

The user may use the current/voltage select switch 54 to select between the display of current and voltage on a current/voltage display 58. Also, a "pass" LED 62 and "fail" LED 66 will indicate that the circuit with leads 12, 14 connected is good (pass) or not good (fail). For a particular application, processor 40 may be programmed internally to begin pulse generation with a very short pulse and then to gradually advance the start of the pulses so that the pulses have a higher magnitude of current while comparing that current magnitude to a pre-selected limit. When the pre-selected current limit is reached or exceeded or a certain number of pulses have been generated without having reached that pre-selected limit, processor 40 displays the results and shuts off.

A receiver probe 100 may be used in conjunction with controller 10. Receiver probe 100 includes a pick-up device 102 that may be an inductive coil for sensing a current pulse on a power line, or a Hall-effect device or a current transformer that is clamped on the line for measuring the magnitude of the current it carries, depending on whether the probe is intended simply to detect a pulse or both to detect it and also to measure its magnitude. The output of pick-up device 102 is fed to a resonator 104 that resonates with the frequency of the pulses. The output of resonator 104 in turn passes through a band pass filter 108. Filter 108 sends the filtered signal both to a positive pulse amplifier 112 and to a negative pulse amplifier 114. Positive pulse amplifier 112 directs positive pulses to a positive pulse analog-to-digital (ND) converter 120; similarly, negative pulse amplifier 114 directs negative pulses to a negative pulse ND converter 122. The outputs of ND converters 120 and 122 are received by a processor 124.

Figure 3:
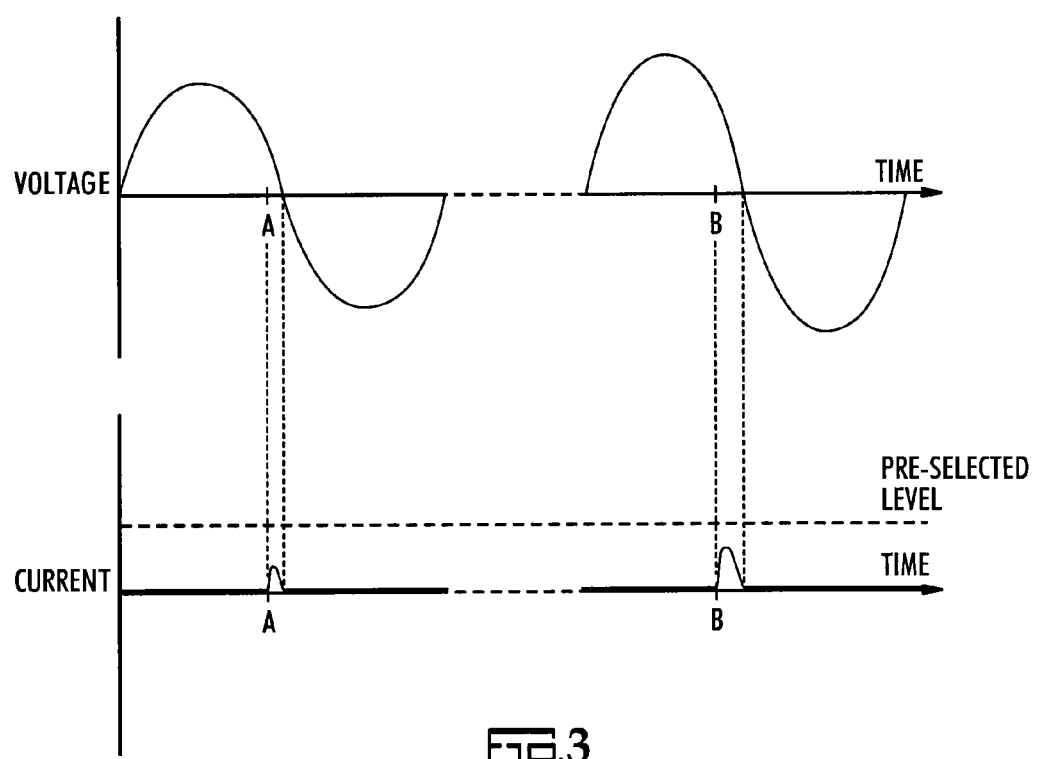
FIG. 3 is a graph relating electrical voltage on a power line and the current pulse on that line caused by the present controller.

Processor 124 of probe 100 receives power from a power source 126 such as a 9-volt battery, and a clock pulse from a precision clock oscillator 130. Processor 124 has three LED (light emitting diodes) lights to signal the results: a status indicator LED 132 that is always on when pulses are being detected, a left direction LED 134 that pulses only when current is flowing to the left of receiver probe 100, such as a negative current, and a right direction LED 136 that pulses only when current is flowing to the right of receiver probe 100, such as a positive current. The appropriate LED, such as LED 134 or LED 136 is illuminated to signal the results FIG. 3 illustrates the capability of controller 10 to cause a pair of power lines to create a current pulse to controller 10. Shown in FIG. 3 is a graph of voltage versus time and current versus time on any given pair of power line. The time lines for both voltage and current are the same; that is, they start at the same point and proceed at the same rate so points A and B on each are the same times from the beginning of the graph on the left. The normal voltage curve for alternating current is sinusoidal, which has a positive portion and a negative portion, and which crosses from positive to negative every 180 degrees. These power lines are normally insulated from each other so there is normally no current across them. However, when the leads of controller are connected to them and briefly shorted, say, for a millisecond, a short current pulse will be generated between those lines. The magnitude of this current pulse depends on the voltage on the line and pulse duration.

If the power lines are shorted at time A while the voltage is still positive but when it is nearing the point where it crosses to negative and that voltage is passed through a rectifier, the current will begin at A and end when the voltage on the power lines crosses to negative. In a subsequent pulse that begins earlier in the positive half of the voltage sine wave, at B, the pulse will be longer (ending at the same cross-over point) and of greater magnitude.

Although the pulses are of short duration, the current can rise to, perhaps thousands of amps. However, SCRs, while rated much lower for a regular duty cycle, are rated much higher for a low duty cycle, so being triggered, say, on the order of every second allows even low-rated SCRs to accommodate high pre-selected currents. For testing household primary power cables, a pre-selected current of about 500 amps is satisfactory.

In a typical example of use, the user would connect leads 12, 14 of a hand-held, battery-powered controller 10 to two power cables at a residence and select current for display on current/voltage display 58 using current/voltage select switch 54. Processor 40 then outputs a small current to SCR 26, shorting the circuit and causing the power source to transmit current pulses. These pulses begin near the end of the positive portion of the alternating current cycle on the power cables. Pulses are then transmitted (as indicated by pulse indicator LED 52) by the power cables. The processor automatically increments backward in time the start of the pulse thereby increasing its magnitude until the pass LED 62 is on.

Figure 4:
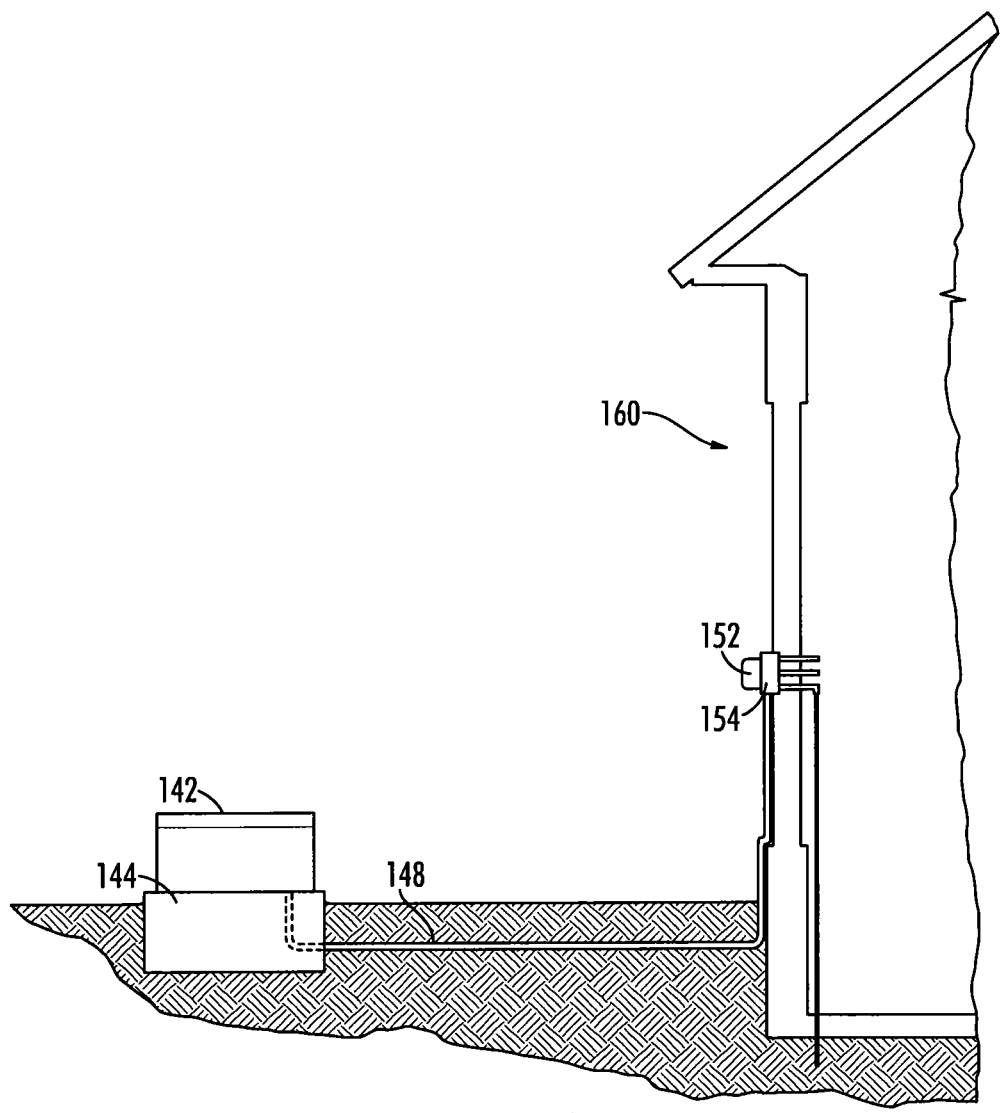
FIG. 4 is a diagram of home electrical service provided via cables from a pad-mounted transformer to an electric meter on the side of the home, according to the prior art.
Figure 5:
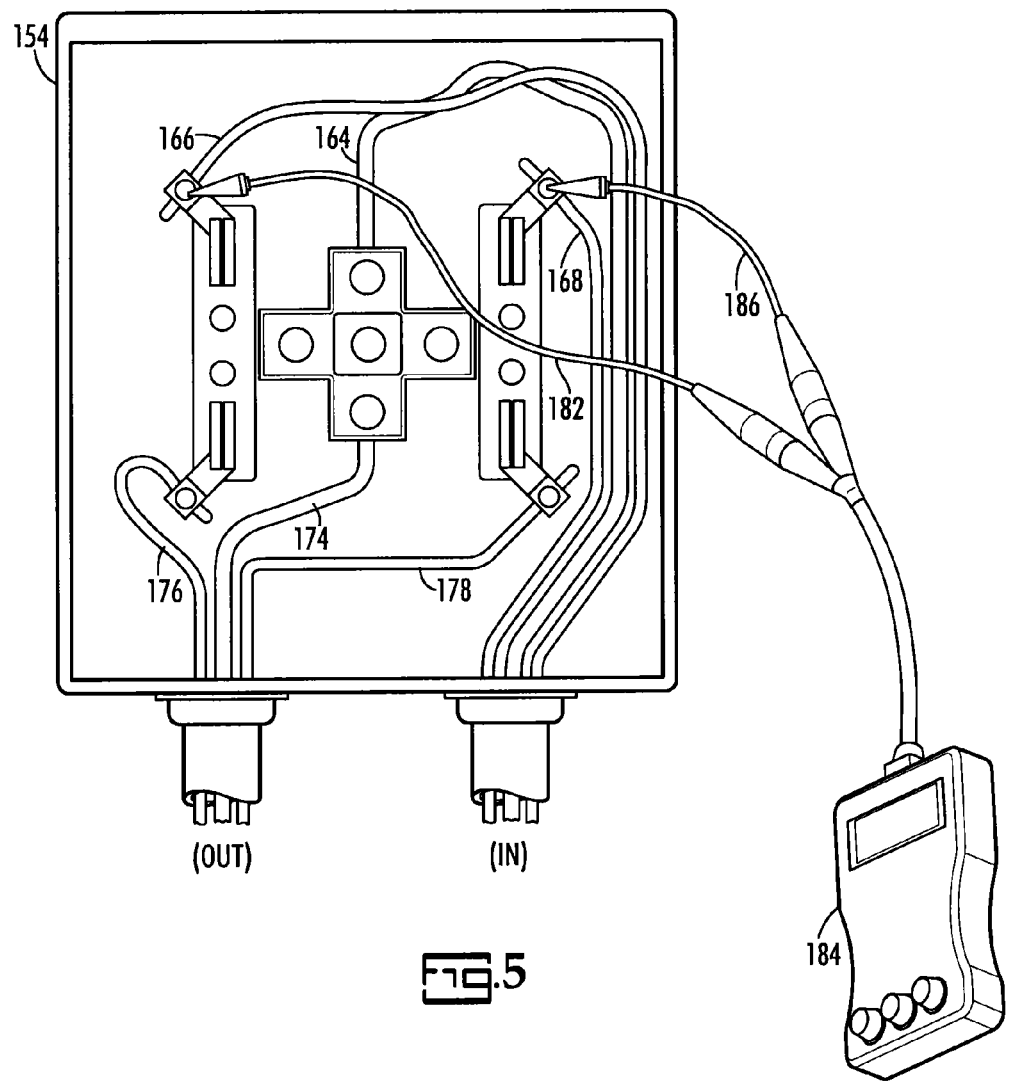
FIG. 5 illustrates the inside of the electric meter of FIG. 4 with the present controller connected thereto, according to the present invention.

With controller 10 by itself (i.e., without receiver probe 100), a service technician can determine if the power cables, such as underground cables, running from a local pad transformer to a residence are sound, that is, whether they are capable of performing at or near specification as opposed to not conducting at all or only somewhat deteriorated to the extent that they are conduct but with slightly higher impedance than sound cables. FIG. 4 shows a transformer 142 mounted on a concrete pad 144. Power cables are run, usually but not always though a conduit 148, to a nearby electric meter 152 mounted on a connection box 154 on the outside of a residence 160. Inside box 154, as seen in FIG. 5, are three incoming power cables, including a ground cable 164, a first 120-volt cable 166 and a second 120-volt cable 168, and three out-going cables corresponding to the incoming cables, namely, a ground cable 174, a 120-volt cable 176, and a second 120-volt cable 178.

When one lead 182 of controller 184 is attached to one power cable, such as incoming 120-volt cable 166, and the other lead 186 is attached to another cable, such as the second incoming 120-volt cable 168, these cables 166, 168, which run between transformer 142 and residence 160 can be tested not just for a shorted or open cable but also to determine whether, for whatever reason, either cable has higher impedance than they should. A user would apply controller leads 182, 186 to each possible pair of cables 164, 166, 168 for three tests to make sure all three cables are sound.

To conduct the test of each cable pair, a short pulse is generated by controller 184 in the cables being tested beginning near the end of the positive portion of the sinusoidally-alternating electrical voltage cycle. The pulse will end when the voltage crosses from positive to negative because SCR 26 (FIG. 1) only conducts in the positive portion of the cycle. Accordingly, the pulse will be very short since the current is oscillating at 60 Hz and the pulse lasts only a small portion of each cycle. The next pulse can occur only during the next positive portion of the sinusoidal voltage wave. If a series of pulses is generated, each will begin slightly earlier than the preceding pulse but still near the end of the positive portion of the alternating current sinusoidal wave, as described above in connection with FIG. 3. The successive pulses in the series will each be longer than the preceding pulses and the current levels reached by successive pulses will each be higher than the last. The level of peak current of successive pulses reflects on the impedance of the power cables being tested and tells the user whether that cable is properly functioning or has deteriorated. The higher the current it can carry, the less its inherent impedance is.

A properly functioning cable that reaches a pre-selected, meaning administratively limited, current limit after a series of pulses, is deemed properly operating. When the level of current of the current pulse cannot reach the pre-selected current limit after a series of pulse to a pre-selected time limit, that is, it times out, the cable is deemed deteriorated to the point where it should be replaced. Prior art detectors can only find shorted or open cables. The relatively small additional impedance of a deteriorated cable that still conducts goes undetected by prior art detectors because they do not use the voltage across the cables to create the current pulse on the cable but simply apply a pulse to cables from an external source of power. A current pulse applied from an external source cannot be used to detect relatively small levels of impedance that may indicate a deteriorated cable.

Figure 6:
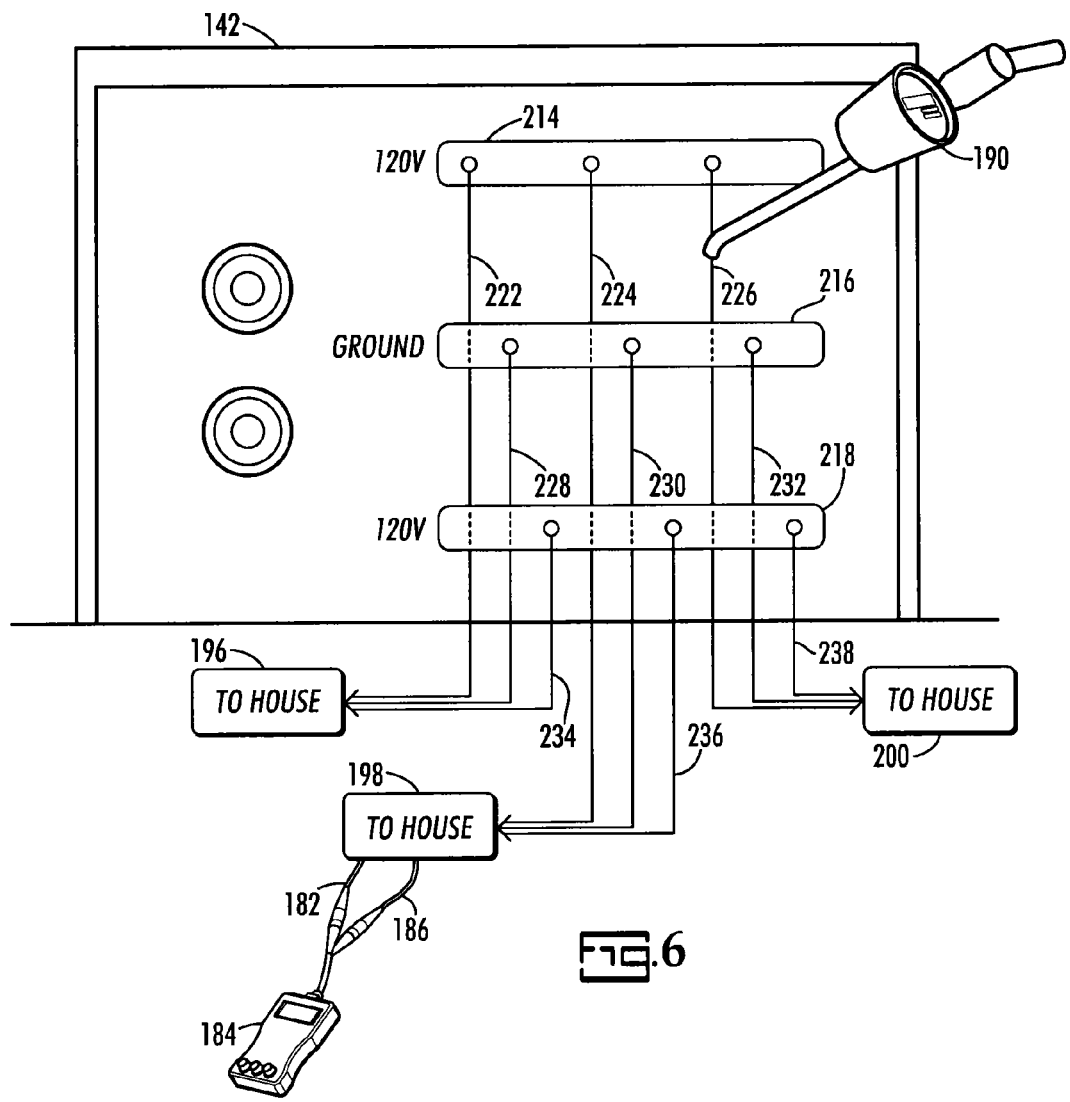
FIG. 6 is a partially schematic illustration of the inside of a multi-residential transformer secondary cabinet, with the present probe and controller shown being used to locate the cables connected to the bus bars in the cabinet that lead to the electric meters of individual residents, such as the electric meter of FIG. 4, according to an embodiment of the present invention.

Referring now to FIGS. 5 and 6, there is shown an example of the present system and method detecting which set of cables at a transformer 142 supply power to residence. Controller 184 (FIG. 5) is set up in the same manner as when used to verify the condition of the cables from transformer 142, namely, that its leads 186, 188, are applied to each possible pair of cables 164, 166, and 168. However, the duration and magnitude of the pulse it creates on the cables does not have to be changed; rather, the same length pulse may be used throughout the testing. The existence of the pulse on a power cable at transformer 142 will indicate that the power cable is in the same circuit as the one on which a pulse was created at connection box 154. In this example, the system uses receiver probe 190 at transformer 142 for detecting the pulse triggered by controller 184.

FIG. 5 illustrates the application of controller 184 to cables 166 and 168.

FIG. 6 illustrates the interior of transformer 142 from which each of three houses 196, 198 and 200 receive electrical power. When a controller 184 is used to cause a pulse in the current carried on a pair of cables at house 198, as suggested by leads 182, 186, of controller 184, receiver probe 190 is applied to the cables running from houses, 196, 198, and 200 to detect the pulse. These cables are attached to bus bars 214, 216, 218 which correspond to a first 120-volt line, a ground, and a second 120-volt line, respectively. From bus bar 214, 120-volt cables 222, 224, 226 run to houses 196, 198, and 200 respectively. From bus bar 216, ground cables 228, 230, 232 run to houses 196, 198, and 200, respectively. Similarly, from bus bar 218, second 120-volt cables 234, 236 and 238 run to houses 196, 198 and 200.

When leads 182 and 186 of controller 184 are applied as shown in FIG. 5, namely, to first and second 120-volt lines 166, 168, respectively, pulses will appear on power cables 224 and 236 and on no others. By moving lead 186 of controller 184 from the second 120-volt power cable to the ground cable 164 (FIG. 5), a pulse can be created that runs through power cables 230 and 236 (FIG. 6). Receiver probe 190 brought in contact with cable 226 detects nothing because the pulse does not run to house 198, notwithstanding the fact that cable 226 is in parallel with cable 224.

Figure 7:
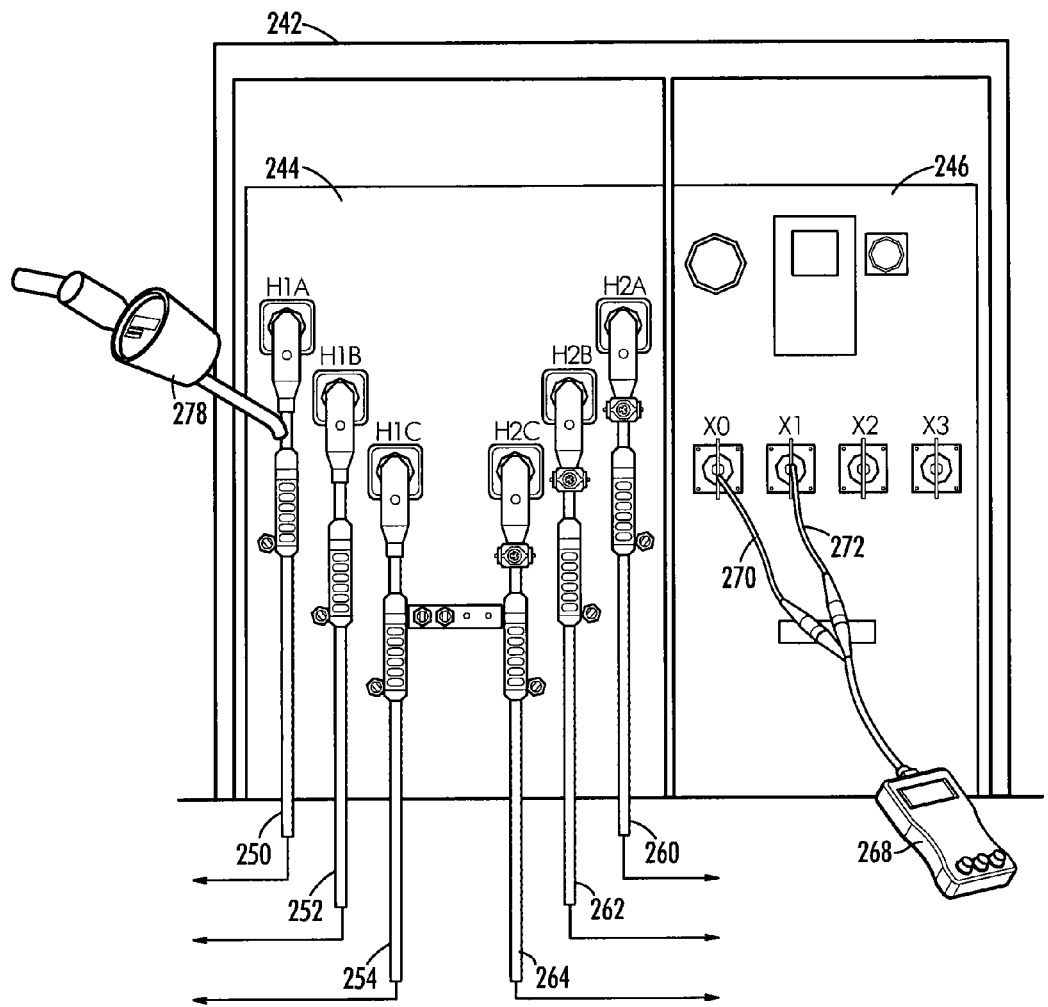
FIG. 7 is a diagram of a prior art transformer showing an arrangement of cables with the present controller and probe being used to identify source cables and load cables, according to an embodiment of the present invention.

FIG. 7 illustrates another application of the present system and method. In FIG. 7, a transformer 242 is illustrated with a primary side 244 and a secondary side 246. Cables 250, 252, 254 run from an electrical power source; cables 260, 262, 264 run to a load. By using a controller 268 with its leads 270 and 272 connected to the secondary side at combinations of X0 for lead 270 and in sequence each of X1, X2, and X3, as shown, for lead 272 of controller 268, a receiver probe 278 can then be used to probe for pulses on cables 250, 252, 254, 260, 262, 264, according to the present invention. Pulses detected show whether cables 250-264 are properly connected to the source side of transformer 242. There will be a pulse on one of cables 250-264 (unless transformer is not a radial feed transformer but is instead a loop feed transformer, in which case there will be a pulse on a second of cables 250-264). Those cables on which no pulses are detected for any combination of positions of leads 270, 272, are load side.

Figure 8:
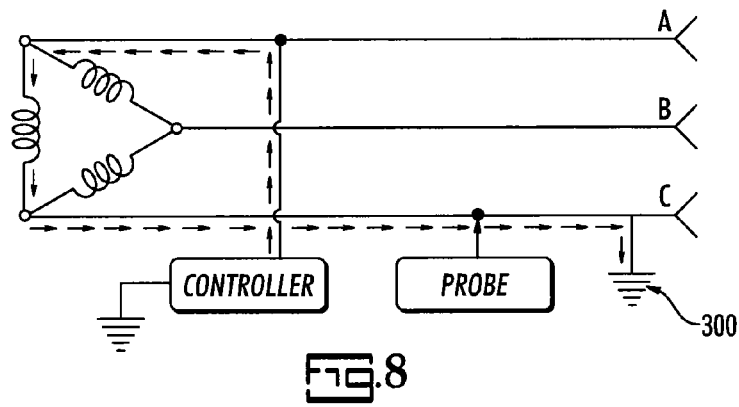
FIG. 8 is a schematic diagram showing the present controller and probe employed in detecting unwanted ground faults.

Detection of the location of an unwanted ground can be done as yet another application of the present system. Referring now to FIG. 8, there in an unwanted ground 300 on power line C of a floating delta transmission line. By using a controller according to the present system to cause power lines A and C to create current pulses originating from the power source, as described above, and by using a probe according to the present system to sense those pulses, a service technician can detect the portion of line C where there are pulses and where there are no pulses. By narrowing the portion of line C between that with pulses and that without, the unwanted ground fault can be found.

Figure 9:
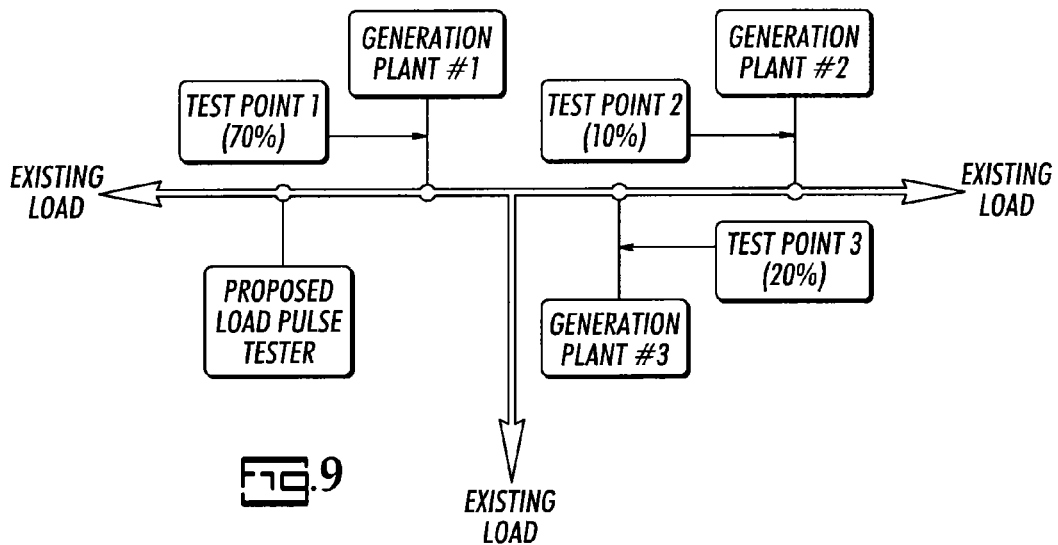
FIG. 9 is a schematic diagram of a portion of a power grid showing three generating facilities and the present controller and probes connected to the grid to measure the percentage of the load being carried by each of those three facilities, according to an embodiment of the invention.

Still another application of the present system and method is in determining how much of the electrical energy generated by a particular generating source is consumed by a new or existing load. Referring now to FIG. 9, there is shown a power grid to which is supplied electrical power from three generation plants, generation plant #1, generation plant #2, and generation plant #3 to existing loads. A controller, according to the present system is established at a proposed load pulse tester location connected to the grid to place a series of pulses of known magnitude on two of the power lines of the grid system running to the load. Three test points, test point 1, test point 2, and test point 3, are established for probing two power lines of the three power lines running from each of generation plants 1, 2 and 3 to their connections to the grid. For the sake of illustration, test point 1 measures the amount of the load generation plant 1 supports as 70% because the magnitude of the current pulse at test point 1 is 70% of the magnitude of the known pulse; similarly, test point 2 measures 10%; and test point 3 measures 20%. Knowing how much of the load is supplied by a particular source informs the owners of an electrical power generating plant whether to build new or upgrade existing lines to serve the load, and may serve other purposes as well.

It will be clear to those of ordinary skill in the art from the foregoing description of several applications of the present system and method that many other applications are possible, with such modifications and substitutions as are readily apparent and appropriate for those applications. For example, the same results with everything described about the present invention could be achieved with a similar invention producing negative pulses. Such modifications and substitutions do not depart from the spirit and scope of the present invention which is defined by the appended claims.

What is claimed is:

1. An apparatus for indicating the transfer of electrical power from a source of electrical power that has a sinusoidally-varying cycle, said source providing electrical power to a first power line and a second power line, said apparatus comprising:
   a controller having
      a first lead and a spaced-apart second lead,
      a half wave rectifier in series between said first and said second leads, said half wave rectifier having a conducting state and a non-conducting state,
      a shunt connected in series with said half wave rectifier and said second lead,
      a processor electrically connected to said half wave rectifier,
      a source of direct current to power said processor,
   said processor triggering said half wave rectifier by a signal to enter said conducting state only near a cross-over point in a positive portion of a cycle of said sinusoidally-varying electrical power source, so that, when said first lead is connected to said first power line from said source and said second lead is connected to said second power line from said source, said half wave rectifier passes current from said first power line through said shunt to said second power line until said half wave rectifier enters said non-conducting state as said source crosses to a negative portion of said cycle, said controller thereby generating a direct current pulse across said first and said second power lines at a frequency consistent with said cycle, said direct current pulse being on any third power line in electrical series with said controller thereby indicating a transfer of power from said first and second power lines to said any third power line.

2. The apparatus as recited in claim 1, wherein said processor further comprises a timer to trigger said conducting state of said half wave rectifier earlier in each cycle so that each successive direct current pulse has a higher magnitude, and wherein said processor measures said higher magnitude of said each successive direct current pulse for comparison to a preset direct current pulse magnitude limit.

3. The apparatus as recited in claim 2, wherein said processor has a display, and wherein said timer of said processor is programmed to stop triggering said conducting state after a preset number of cycles or said preset direct current pulse magnitude limit is reached, and to display a highest magnitude of a successive direct current pulse.

4. The apparatus as recited in claim 1, wherein said controller further comprises a blocking diode in series with and between said first lead and said half wave rectifier to augment said non-conducting state of said half wave rectifier.

5. The apparatus as recited in claim 1, further comprising a probe having a pick up device for sensing said direct current pulse in said any third power line.

6. The apparatus as recited in claim 1, wherein said apparatus further comprises a first separate fuse connected between said first lead and said first power line and a second separate fuse connected between said second lead and said second power line.

7. The apparatus as recited in claim 5, wherein said direct current pulse has a magnitude and wherein said probe further comprises a display of the magnitude of said direct current pulse.

8. The apparatus as recited in claim 5, wherein said probe further comprises a positive pulse display and a negative pulse display, said positive pulse display indicating said direct current pulse is positive and said negative pulse display indicating said direct current pulse is negative, whereby said positive and negative pulse displays indicate the direction of said direct current pulse on said any third power line.

9. The apparatus as recited in claim 1, wherein said processor further comprises a synchronizing circuit connected to said first lead to synchronize said processor to said sinusoidally varying electrical power system before triggering said half wave rectifier to said conducting state in said positive portion of said cycle.

10. The apparatus as recited in claim 1, wherein said controller further comprises a noise filter to remove electrical noise from said signal from said processor to said half-wave rectifier.

11. The apparatus as recited in claim 1, wherein said second power line is a ground line.

12. A method of using an apparatus comprising a controller having a first lead and a spaced-apart second lead, a half wave rectifier in series between said first and said second leads, said half wave rectifier having a conducting state and a non-conducting state, a shunt connected in series with said half wave rectifier and between said rectifier and said second lead, a processor electrically connected to said half wave rectifier, and a source of direct current to power said processor, said method comprising the steps of:
   (a) connecting said first lead to said first power line;
   (b) connecting said second lead to said second power line; and
   (c) when said processor triggers said half wave rectifier to said conducting state to thereby generate said direct current pulse, detecting whether a third power line carries a direct current pulse, said third power line being connected in series to said first and second power line if said third power line carries said direct current pulse and not being connected in series to said first and second power line if said third power line is not carrying said direct current pulse.

13. The method as recited in claim 12, further comprising the step of detecting whether said direct current pulse is positive or negative thereby indicating that said third power line is flowing from or to said first power line, respectively.

14. The method as recited in claim 12, wherein said processor further comprises a timer to trigger said conducting state of said half wave rectifier earlier in each cycle, said timer starting each conducting state incrementally earlier so that a subsequent direct current pulse produced in said each conducting state has a higher magnitude, and wherein said processor is in electrical connection with said shunt so that said processor measures said magnitude of said subsequent direct current pulse for comparison to a preset current pulse magnitude limit, and wherein said method further comprises the step of measuring the magnitude of said subsequent direct current pulse and comparing said measured magnitude of said subsequent direct current pulse to said preset current pulse magnitude limit to determine the condition of said first and second power lines.

15. The method as recited in claim 12, wherein said apparatus further comprises a probe, and wherein said method further comprises the step of using said probe at a first location to detect said pulse on said a third power line at said first location.

16. The method as recited in claim 15, further comprising the steps of:
(a) if no direct current pulse is detected with said probe in said third power line at said first location, moving said probe to a second location closer to said first power line than said first location; and
(b) using said probe to detect said direct current pulse on said third power line at said second location, said probe indicating a ground fault between said first and said second locations if a direct current pulse is detected at said second location and indicating said ground fault between said source and said second location if said direct current pulse is not detected at said second location.

17. The method as recited in claim 12, wherein said first and said second power lines are on the secondary side of a transformer and said any third power line is on the primary side of said transformer, and wherein said method comprises the step of probing said third power line on said primary side of said transformer for said direct current pulse.

18. The method as recited in claim 12, wherein said first and said second power lines are associated with one resident of multiple residences and said any third power line is in a connection box associated with said multiple residences, and wherein said method comprises the step of probing said third power line in said connection box for said direct current pulse.

19. The method as recited in claim 15, wherein said probe further comprises a positive pulse display and a negative pulse display, and wherein the method further comprises the step of viewing said positive pulse display and said negative pulse display to determine whether said third power line runs from a power source or runs from a load.

20. The method of claim 15, further comprising the steps of:
(a) measuring the magnitude of said direct current pulse using said probe at a third power line coming from a first electrical power generation plant;
(b) measuring the magnitude of said direct current pulse using said probe on a fourth power line coming from a second electrical power generation plant; and
(b) comparing said magnitudes of said direct current pulses on said third and fourth power lines to determine the percentage of power consumed by said load that is provided by said first and said second electrical power generation plants, respectively.

* * * * *